US009753372B2

(12) United States Patent
Franken

(10) Patent No.: US 9,753,372 B2
(45) Date of Patent: Sep. 5, 2017

(54) RADIATION SOURCE FOR AN EUV OPTICAL LITHOGRAPHIC APPARATUS, AND LITHOGRAPHIC APPARATUS COMPRISING SUCH A RADIATION SOURCE

(71) Applicant: ASML Netherlands B.V., Veldhoven (NL)

(72) Inventor: Johannes Christiaan Leonardus Franken, Knegsel (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 14/899,196

(22) PCT Filed: Jun. 5, 2014

(86) PCT No.: PCT/EP2014/061710
§ 371 (c)(1),
(2) Date: Dec. 17, 2015

(87) PCT Pub. No.: WO2014/206706
PCT Pub. Date: Dec. 31, 2014

(65) Prior Publication Data
US 2016/0147160 A1 May 26, 2016

Related U.S. Application Data

(60) Provisional application No. 61/840,878, filed on Jun. 28, 2013.

(51) Int. Cl.
*G03B 27/54* (2006.01)
*G03F 7/20* (2006.01)
*H05G 2/00* (2006.01)

(52) U.S. Cl.
CPC ...... *G03F 7/70033* (2013.01); *G03F 7/70916* (2013.01); *H05G 2/005* (2013.01)

(58) Field of Classification Search
CPC .. G03F 7/70033; G03F 7/70916; H05G 2/005
(Continued)

(56) References Cited

U.S. PATENT DOCUMENTS 3,813,771 A 6/1974 Skogland
9,494,879 B2 * 11/2016 Luijten ............... G03F 7/70916
(Continued)

FOREIGN PATENT DOCUMENTS

GB        1 431 386        4/1976
WO   WO 2012/144586 A1   10/2012
WO   WO 2013/068197 A1    5/2013

OTHER PUBLICATIONS

International Preliminary Report on Patentability and Written Opinion of the International Searching Authority directed to related International Patent Application No. PCT/EP2014/061710, issued Dec. 29, 2015; 9 pages.

(Continued)

*Primary Examiner* — Peter B Kim
(74) *Attorney, Agent, or Firm* — Sterne, Kessler, Goldstein & Fox P.L.L.C.

(57) ABSTRACT

A radiation source generates extreme ultraviolet radiation. The radiation source comprises a plasma formation site located at a position in which a fuel will be contacted by a beam of radiation to form a plasma. A receiving structure is provided to trap debris particles on its surface that are generated with the formation of the plasma. The receiving structure has a rod-shaped heater element for heating the receiving surface, the device preventing large droplets of fuel from forming on the receiving surface. Instead, the trapped fuel is melted off the receiving surface.

20 Claims, 4 Drawing Sheets

(58) Field of Classification Search
USPC .......................................................... 355/67
See application file for complete search history.

(56) References Cited

U.S. PATENT DOCUMENTS

| | | |
|---|---|---|
| 2006/0175558 A1 | 8/2006 | Bakker et al. |
| 2008/0179548 A1 | 7/2008 | Bykanov et al. |
| 2010/0038562 A1 | 2/2010 | Schimmel et al. |
| 2011/0164236 A1 | 7/2011 | Yakunin et al. |
| 2014/0183180 A1 | 7/2014 | Watakabe et al. |

OTHER PUBLICATIONS

International Search Report directed to related International Patent Application No. PCT/EP2014/061710, mailed Oct. 15, 2014; 6 pages.

* cited by examiner

RADIATION SOURCE FOR AN EUV OPTICAL LITHOGRAPHIC APPARATUS, AND LITHOGRAPHIC APPARATUS COMPRISING SUCH A RADIATION SOURCE

CROSS-REFERENCE TO RELATED APPLICATIONS

This application claims the benefit of U.S. provisional application 61/840,878, which was filed on 28 Jun. 2013, and which is incorporated herein in its entirety by reference

FIELD

The present invention relates to a power source for a lithographic apparatus, and associated lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma (LPP) sources, discharge-produced plasma (DPP) sources, or sources based on synchrotron radiation provided by an electron storage ring.

EUV radiation may be produced using a plasma. A radiation source apparatus for producing EUV radiation may include a laser for exciting a fuel to provide the plasma, and a source collector apparatus for containing the plasma. The plasma may be created, for example, by directing a laser beam at a fuel, such as particles of a suitable material (e.g. tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector apparatus may include an enclosing structure or chamber arranged to provide a vacuum environment to support the plasma. Such a radiation source apparatus is typically termed a laser produced plasma (LPP) source.

As a by-product of the plasma generation, debris of the fuel material in the form of vapor, dust or droplets is ejected in many directions, as well as the wanted EUV radiation. The radiation source apparatus typically includes many structures and subsystems to manage this material, which otherwise would quickly contaminate optical surfaces and degrade performance. One such measure is to provide a receiving structure that surrounds the beam to intercept and trap the fuel debris. The structure may be heated to a temperature at which the debris will melt and run into drainage channels so that it can be removed from the environment, whether occasionally or continuously during operation. An example of such an apparatus is disclosed in published patent application US 2008179548. To liquefy the debris in the case of tin as a fuel, the temperature of the receiving structure surface may be approximately 300° C.

To maximize the intercepting surface and discourage rebounding of debris back into the environment, the receiving structure typically has a convoluted surface, for example covered in fins or vanes or other local structural elements. The heating of all these elements to the correct temperature brings many challenges. The patent application US 2008179548 mentions resistive heating, or alternatively fluid heating using water or liquid gallium. Because of the large number local structural elements requiring their own heating, the heating system becomes very complex. The prevailing method example of resistive heating requires a thermally conductive connection from each heating element into the receiving structure. Materials used for this element and connection must be EUV- and vacuum-compatible, limiting the choice of materials. Inefficiency in the transfer of heat to the structure implies that the elements themselves reach a much higher temperature. This brings further challenges for the selection of materials and reliability.

SUMMARY

It is desirable to provide a control of the heating element. The invention in a first aspect provides a radiation source apparatus configured to generate a beam of radiation by excitation of a fuel into a plasma, said apparatus comprising a plasma formation site located at a position in which a fuel will be contacted by a laser beam of radiation to form a plasma; a receiving structure having a receiving surface for capturing fuel debris that is generated with the formation of the plasma; and a heating arrangement for heating one or more receiving surfaces of said receiving structure to a temperature sufficient to liquefy said fuel debris such that it can be made to flow along the surface to another part of the apparatus, said arrangement comprising a heater element for heating of said receiving surface, wherein a portion of the heater element has an adjustable length for providing heating control of the heater element.

The invention in a further aspect provides for a lithographic apparatus, comprising a radiation source of the first aspect, configured to generate a beam of EUV radiation.

A lithographic apparatus is just one example of an EUV optical apparatus. The invention further provides an optical apparatus, comprising a radiation source according to the first aspect of the invention as set forth above, configured to generate a beam of EUV radiation, and EUV optical systems configured to receive and condition the beam and to deliver the beam to a target location.

Another embodiment of the present invention provides for a method of generating extreme ultraviolet radiation, the method comprising contacting a fuel with a beam of radiation, thereby forming a plasma at a plasma formation site, providing a receiving structure having a receiving surface configured to trap debris particles that are generated with the formation of the plasma; and heating the receiving surface with a heating element inserted in an opening of the receiving structure.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

Figure 4:
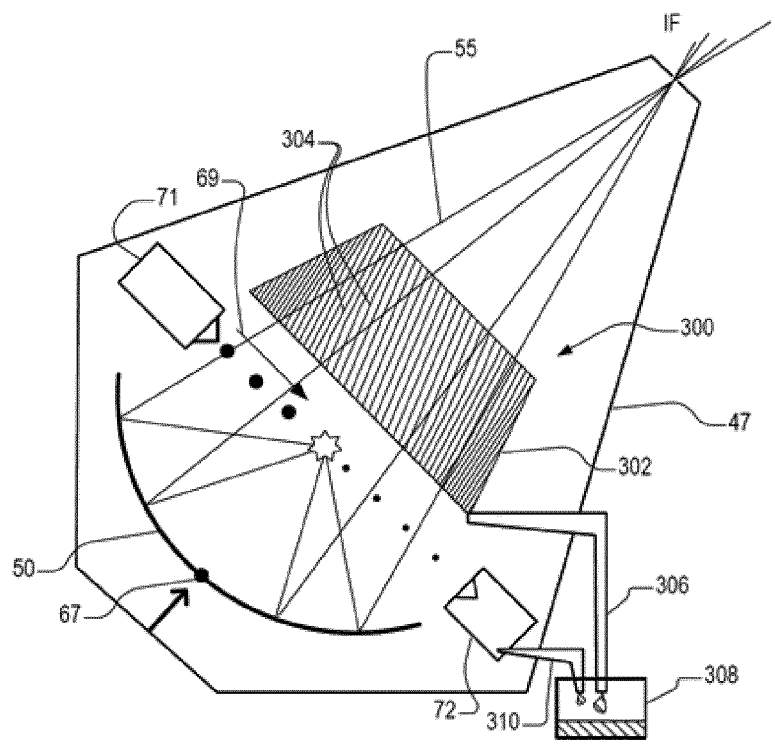
FIG. 4 is an enlarged schematic view of a radiation source apparatus having a receiving structure (such as a contamination trap) including numerous local structural elements in the form of vanes.
Figure 5:
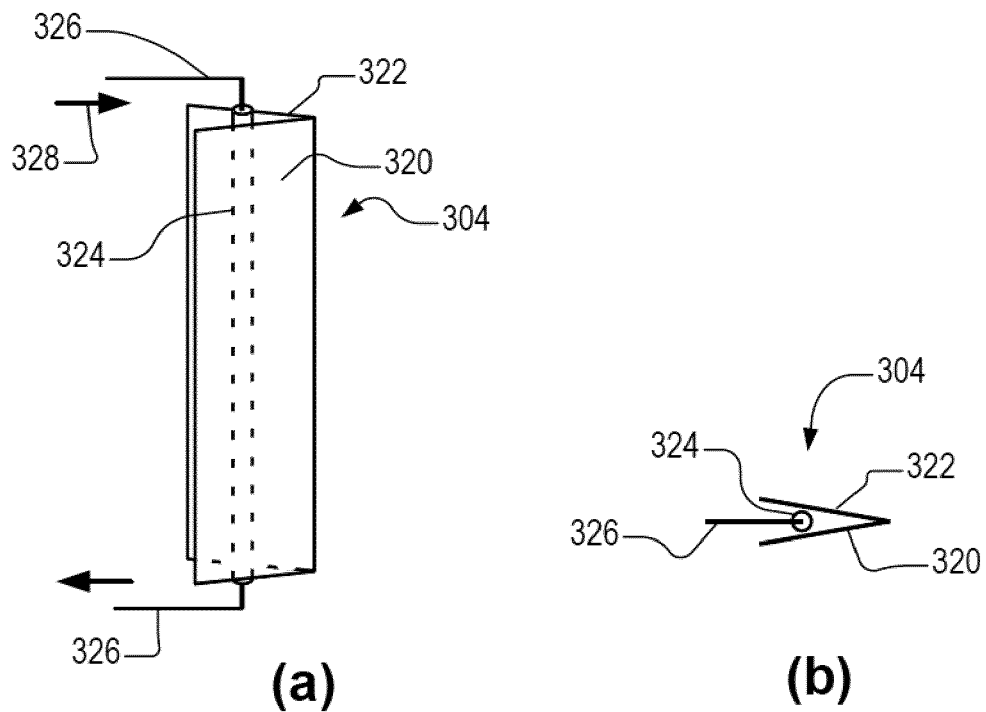
Figure 6:
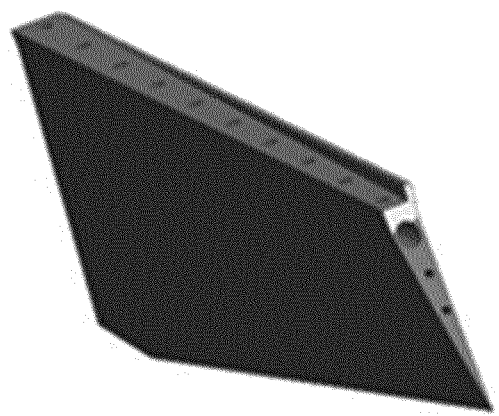
Figure 7:
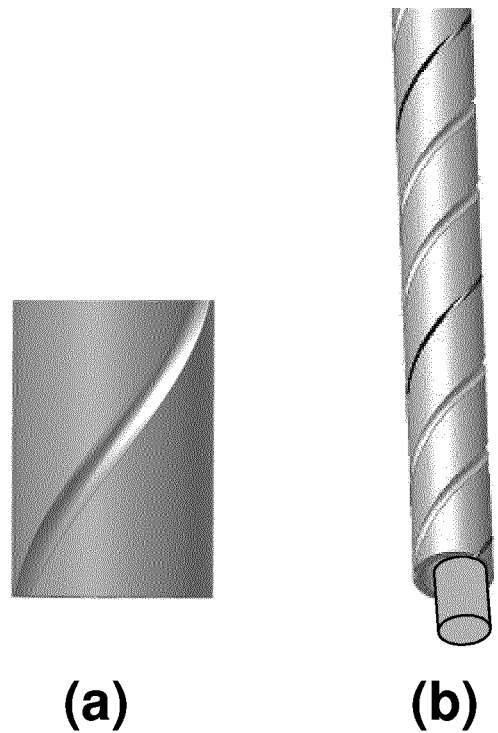

FIG. 5 schematically depicts a single vane being part of the receiving structure of FIG. 4 with a heating element, to illustrate the principle of a heating arrangement applied to the receiving structure of FIG. 4 in embodiments of the present invention;

FIG. 6 schematically depicts the form of a single vane comprising a longitudinal opening for receiving a heating element; and FIG. 7 schematically depicts the form of a heating element for a heating arrangement in accordance with embodiments of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION OF EXEMPLARY EMBODIMENTS

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present invention may be implemented.

Figure 1:
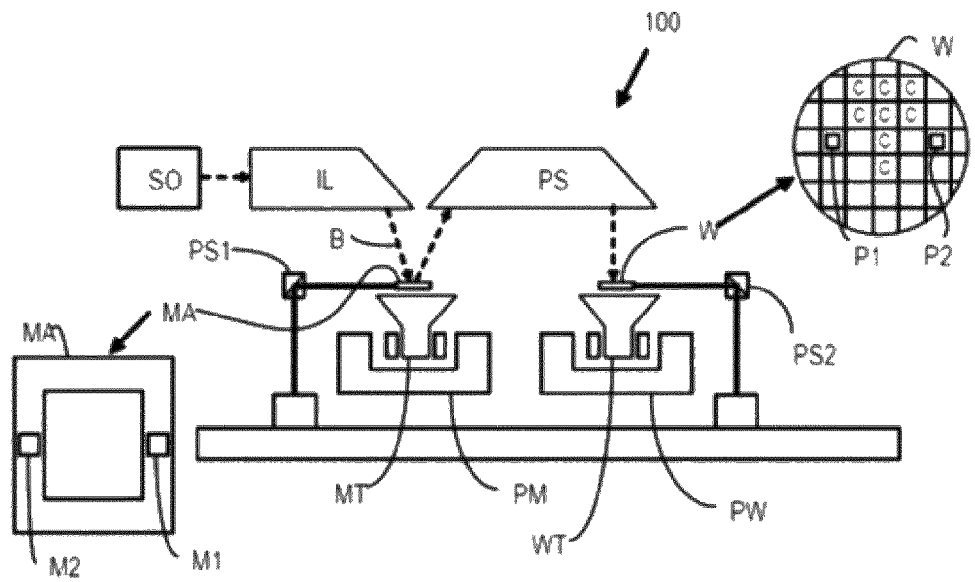
FIG. 1 depicts schematically a lithographic apparatus having reflective projection optics.

FIG. 1 schematically depicts a lithographic apparatus 100 including a source module SO according to one embodiment of the invention. The apparatus comprises:

- an illumination system (illuminator) IL configured to condition a radiation beam B (e.g. EUV radiation).
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist-coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source module SO may be part of an EUV radiation source apparatus including a laser, not shown in FIG. 1, for providing the laser beam exciting the fuel. The resulting plasma emits output radiation, e.g., EUV radiation, which is collected using a radiation collector, disposed in the source module. The laser and the source module may be separate entities, for example when a CO2 laser is used to provide the laser beam for fuel excitation.

In such cases, the laser is not considered to form part of the lithographic apparatus and the radiation beam is passed from the laser to the source module with the aid of a beam delivery system comprising, for example, suitable directing mirrors and/or a beam expander. In other cases the source may be an integral part of the source module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

Figure 2:
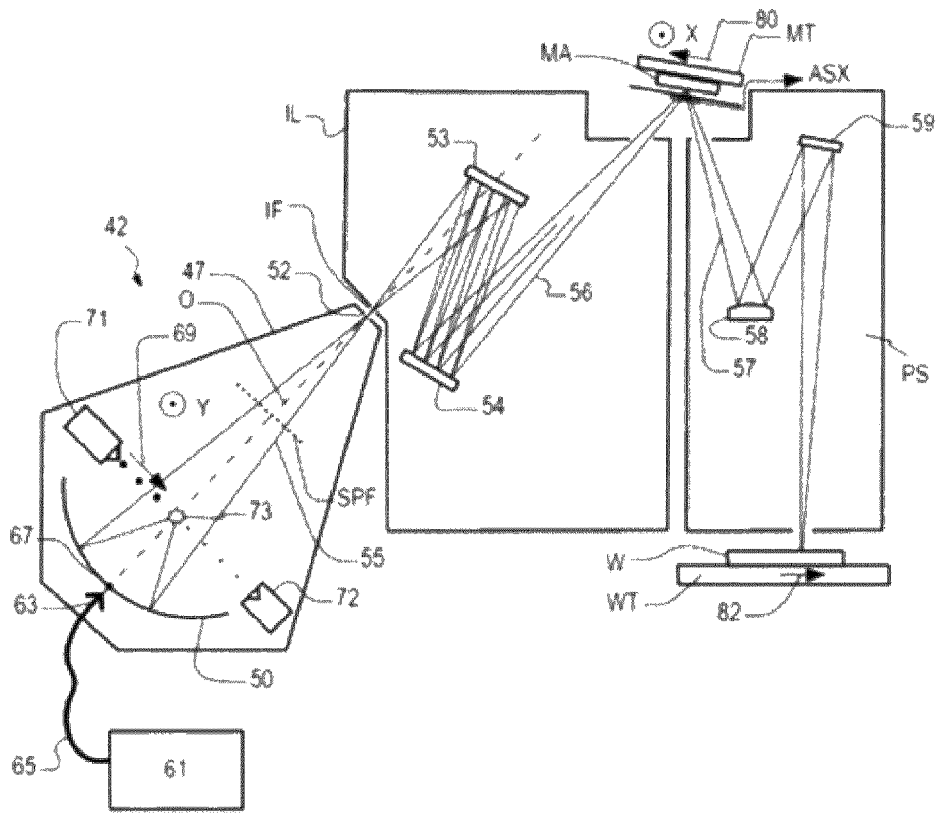
FIG. 2 is a more detailed view of the apparatus of FIG. 1 including a plasma-based radiation source apparatus.

FIG. 2 shows an embodiment of the lithographic apparatus 100 in more detail, including a source module SO, the illumination system IL, and the projection system PS. The source module in this example comprises a radiation source apparatus 42 of the type that uses a laser-produced plasma as a radiation source. EUV radiation may be produced by a gas or vapor, for example Xe gas, Li vapor or Sn vapor, jets of gaseous or liquid target material or a solid target material such as a block, a tape or a wire of tin, in which a very hot plasma is created to emit radiation in the EUV range of the electromagnetic spectrum. The very hot plasma is created by causing an at least partially ionized plasma by, for example, optical excitation using $CO_2$ laser light. Partial pressures of, for example, 10 Pa of Xe, Li, Sn vapor or any other suitable gas or vapor may be required for efficient generation of the radiation. In an embodiment, Sn is used to create the plasma in order to emit the radiation in the EUV range.

The radiation source apparatus 42 embodies the function of source SO in the apparatus of FIG. 1. Apparatus 42 comprises a source chamber 47, in this embodiment not only substantially enclosing a source of EUV radiation, but also collector 50 which, in the example of FIG. 2, is a normal-incidence collector, for instance a multi-layer mirror.

As part of an LPP radiation source, a laser system 61 (described in more detail below) is constructed and arranged to provide a laser beam 63 which is delivered by a beam delivering system 65 through an aperture 67 provided in the collector 50. Also, the apparatus includes a target material 69, such as Sn or Xe, which is supplied by target material supply 71. The beam delivering system 65, in this embodiment, is arranged to establish a beam path focused substantially upon a desired plasma formation position 73.

In operation, the target material 69, which may also be referred to as fuel, is supplied by the target material supply 71 in the form of droplets. When such a droplet of the target material 69 reaches the plasma formation position 73, the laser beam 63 impinges on the droplet and an EUV radiation-emitting plasma forms inside the source chamber 47. In the case of a pulsed laser, this involves timing the pulse of laser radiation to coincide with the passage of the droplet through the position 73. As mentioned, the fuel may be for example xenon (Xe), tin (Sn) or lithium (Li). These create a highly ionized plasma with electron temperatures of several 10's of eV. Higher energy EUV radiation may be generated with other fuel materials, for example Tb and Gd. The energetic radiation generated during de-excitation and recombination of these ions includes the wanted EUV radiation which is emitted from the plasma at position 73.

The plasma formation position 73 and the aperture 52 are located at first and second focal points of collector 50, respectively and the EUV radiation is focused by the normal-incidence collector 50 onto the intermediate focus point IF.

The beam of radiation emanating from the source chamber 47 traverses the illumination system IL via so-called normal incidence reflectors 53, 54, as indicated in FIG. 2 by the radiation beam 56. The normal incidence reflectors direct the beam 56 onto a patterning device (e.g. reticle or mask) positioned on a support (e.g. reticle or mask table) MT. A patterned beam 57 is formed, which is imaged by projection system PS via reflective elements 58, 59 onto a substrate carried by wafer stage or substrate table WT. More elements than shown may generally be present in illumination system IL and projection system PS. For example there may be one, two, three, four or even more reflective elements present than the two elements 58 and 59 shown in FIG. 2. Radiation collectors similar to radiation collector 50 are known from the prior art.

As the skilled reader will know, reference axes X, Y and Z may be defined for measuring and describing the geometry and behavior of the apparatus, its various components, and the radiation beams 55, 56, 57. At each part of the apparatus, a local reference frame of X, Y and Z axes may be defined. The Z axis broadly coincides with the direction of optical axis O at a given point in the system, and is generally normal to the plane of a patterning device (reticle) MA and normal to the plane of substrate W. In the source collector module 42, the X axis coincides broadly with the direction of fuel stream (69, described below), while the Y axis is orthogonal to that, pointing out of the page as indicated in FIG. 2. On the other hand, in the vicinity of the support structure MT that holds the reticle MA, the X axis is generally transverse to a scanning direction aligned with the Y axis. Arrows 80 and 82 indicate the scanning directions of the reticle MA and the substrate W, respectively. For convenience, in this area of the schematic diagram FIG. 2, the X axis points out of the page, again as marked. These designations are conventional in the art and will be adopted herein for convenience. In principle, any reference frame can be chosen to describe the apparatus and its behavior.

To deliver the fuel, which for example is liquid tin, a droplet generator or target material supply 71 is arranged within the source chamber 47, to fire a stream of droplets towards the plasma formation position 73. In operation, laser beam 63 may be delivered in synchronization with the operation of target material supply 71, to deliver impulses of radiation to turn each fuel droplet into a plasma. The frequency of delivery of droplets may be several kilohertz, or even several tens or hundreds of kilohertz. Typically, in present arrangements, a laser beam 63 may be delivered by a laser system 61 in at least two pulses: a pre pulse PP with limited energy is delivered to the droplet before it reaches the plasma location, in order to deform (change geometry) or vaporize the fuel material into a preferably pancake or cigar like shape or a small cloud (preconditioning the droplet), and then a main pulse MP of laser energy is delivered to the cloud at the desired location, to generate the plasma. In a typical example, the diameter of the plasma is about 2-3 mm A trap 72 is provided on the opposite side of the enclosing structure 47, to capture fuel that is not, for whatever reason, turned into plasma.

Laser system 61 may be for example the MOPA (Master Oscillator Power Amplifier) type. Such a laser system 61 includes a "master" laser or "seed" laser, followed by a power amplifier system PA, for firing a main pulse of laser energy towards an expanded droplet cloud. A beam delivery system 24 is provided to deliver the laser energy 63 into the source chamber 47. Laser system 61, target material supply 71 and other components can be controlled by a controller (not shown separately). The controller performs many control functions, and has sensor inputs and control outputs for various elements of the system. Sensors may be located in and around the elements of apparatus 42, and optionally elsewhere in the lithographic apparatus.

In one alternative LPP source, the main pulse laser beam is directed onto the fuel droplet from the direction of the intermediate focus point IF, such that the collected EUV radiation is that which is emitted generally in the direction from which the main laser pulse was received. The main pulse beam may in that case be delivered to a plasma generation site via at least one optical element (such as a lens or folding mirror). The EUV radiation may be collected by a grazing incidence collector such as those used in discharge produced plasma (DPP) sources. Various ancillary components may be included in practice. For example a debris trap may comprise one or more stationary foil traps and/or a rotating foil trap.

Figure 3:
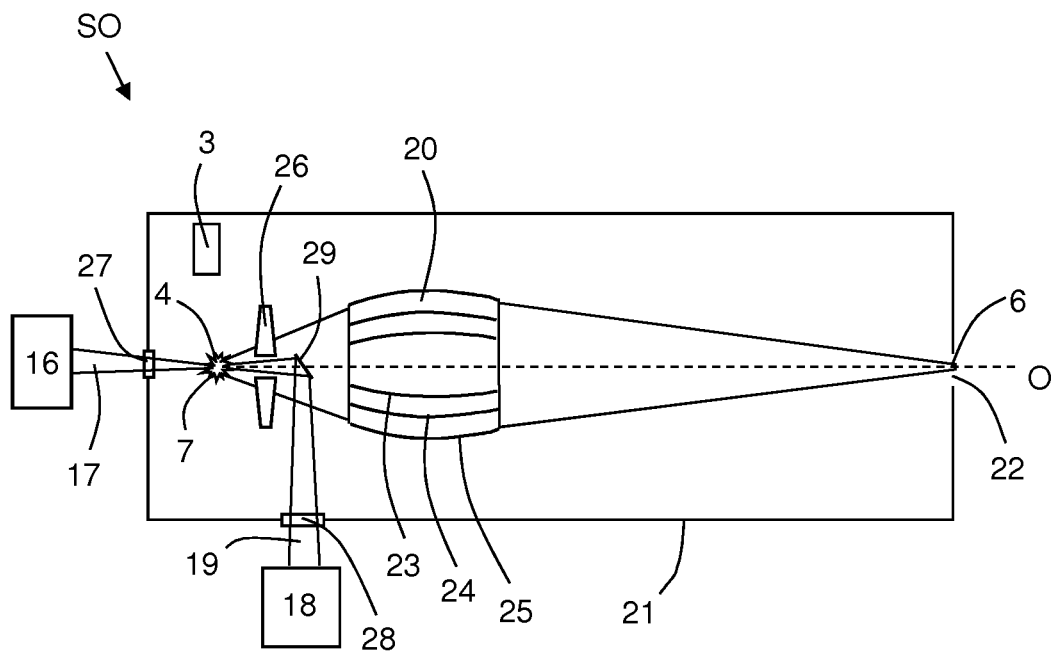
FIG. 3 is an alternative radiation source.

FIG. 3 shows such an alternative laser produced plasma (LPP) radiation source SO which has an alternative configuration to the radiation source shown in FIG. 2. The radiation source SO includes a fuel emitter 3 which is configured to deliver fuel to a plasma formation region 4. The fuel may for example be tin, and tin is referred to in the following description. However, any suitable fuel may be used. A pre-pulse laser 16 emits a pre-pulse laser beam 17 which is incident upon the tin. The pre-pulse laser beam 17 acts to preheat the tin, thereby changing a property of the tin such as its size and/or shape. A main laser 18 emits a main laser beam 19 which is incident upon the tin after the pre-pulse laser beam 17. The main laser beam delivers energy to the tin and thereby coverts the tin into an EUV radiation emitting plasma 7.

A radiation collector 20, which may be a grazing incidence collector, is configured to collect the EUV radiation and focus the EUV radiation at a point 6 which is commonly referred to as the intermediate focus. Thus, an image of the radiation emitting plasma 7 is formed at the intermediate focus 6. An enclosure structure 21 of the radiation source SO includes an opening 22 which is at or near to the intermediate focus 6. The EUV radiation passes through the opening 22 to a lithographic apparatus illumination system. The radiation collector 20 is depicted as a nested collector with grazing incidence reflectors 23, 24 and 25. The grazing incidence reflectors 23, 24 and 25 are disposed axially symmetrically around an optical axis O. The illustrated radiation collector 20 is shown merely as an example, and other radiation collectors may be used.

A debris trap 26 is located between the plasma formation region 4 and the radiation collector 20. The debris trap 26 may for example be a rotating foil trap, or may be any other suitable form of debris trap. In some embodiments the debris trap 26 may be omitted.

The enclosure structure 21 includes a window 27 through which the pre-pulse laser beam 17 can pass to the plasma formation region 4, and a window 28 through which the main laser beam 19 can pass to the plasma formation region. A mirror 29 is used to direct the main laser beam 19 through an opening in the debris trap 26 to the plasma formation region 4.

A gas (for example, Hydrogen or Nitrogen) may be provided from one or more inlets at various positions in the source chamber 47 which introduce gas into the source SO in order to allow a gas flow to be established (for example outside of the light path). This gas flow may assist in drawing debris out of the source SO via the outlet, and thereby reduce contamination of the collector and other reflective surfaces of the lithographic apparatus. The gas may further locally assist in heat transport, especially in compact openings such as various passageways.

Numerous additional components may be present in a typical apparatus, though not illustrated here. These include arrangements for reducing or mitigating the effects of contamination within the enclosed vacuum, for example to prevent deposits of fuel material damaging or impairing the performance of collector 50 or 20 and other optics. Various systems for the delivery and extraction of gases to control the pressure and composition of the environment will also be included, as well as to create gas flows to steer contaminants away from the most critical and/or vulnerable locations. For example, hydrogen gas in molecular and/or atomic form may be used, due to its cleaning properties. Other features present but not described in detail are all the sensors, controllers and actuators involved in controlling of the various components and sub-systems of the lithographic apparatus.

An issue with a receiving structure arranged to intercept and trap the fuel debris is that accumulation of tin leads to droplet formation, with large droplets forming (>10 μm's up to mm's). These large droplets will fall onto the collector under the influence of gravity, rather than being swept out by the protective gas flow in the source. Removing the droplets from the collector requires shutdown of the system.

FIG. 4 shows an enlarged schematic view of the radiation source apparatus 42 from FIG. 2, and in particular shows a receiving structure 300 which surrounds the EUV beam 55 within source chamber 47. Receiving structure 300 can take many forms but typically comprises a frusto-conical wall 302 lined with local structural elements presenting local receiving surfaces to entrap fuel material ejected from the plasma. The local structural elements in this example comprise vanes 304 running obliquely around the inside of the conical wall. There may be for example at least 50, 60 or more vanes. As explained in the introduction, the vanes will be heated by means to be described, so that fuel debris does remain solidly attached to the surfaces, but melts and forms droplets that will run along and between the vanes to be collected and removed outside the chamber 47. The fuel will be assumed to be tin, for the sake of this example. The vanes and other channels are shaped and oriented to guide the falling tin to a drain 306 and so into a tin collector 308. The drains and optionally the collector may be heated also, to maintain liquid flow in the tin material. In an embodiment based on tin as fuel, the vanes (and other heated surfaces such as drains) are to be maintained at around 300° C. The same tin collector 308 may for example be shared with the trap 72 connected by another drain 310. The tin collector may be inside or outside the chamber 47. Collected tin may be purified and recycled to the droplet generator 71, or discarded for other uses.

FIG. 5 illustrates an individual vane 304 in a design of a receiving structure 300. FIG. 5(a) is a side view, while FIG. 5(b) is an end view. The vane is formed effectively from a piece of sheet metal that is folded in a V-shape to form walls 320, 322 as shown, such that the vane is hollow and thereby the inner space forms an opening. Due to the opening it is possible that gas present in the radiation source chamber will also be present inside the vane, thereby improving heat transfer from a heater element to the V-shaped vane walls. In the space between the walls there is a heater element 324, which may be a heater rod with a coil of resistance wire as described further below. Through external connections 326 a DC-current 328 is injected into the resistance wire that causes the wire and rod 324 to heat up. The heat is radiated to the vane. Heater elements for multiple vanes (not shown in FIG. 5) could be connected in series, or in parallel, or they may be supplied individually. This cause the heater rod to warm up. Heater elements for multiple vanes (not shown in FIG. 5) could be connected in series, or in parallel, or they may be supplied individually. The vanes in FIG. 5 are depicted as V-shaped having an open space such that heat will predominantly be transported through the V-surface. Alternatively, the vanes may be made of a bulk heat conductive material and have openings to insert one heater element or more heater elements connected in series or parallel, or not interconnected, in order to provide improved heat conduction and as such a more uniform heating through the full volume of the vane. Also the shape of the vanes may take any form, such as U-shaped or rectangular shaped. The FIG. 5 arrangement may be used in EUV radiation source apparatuses for commercial lithographic apparatus.

FIG. 6 represents a single segment of a vane assay which comprises, or is made of, a heat conductive material provided with an opening such as a longitudinal passageway. The vane may have a thickness of 10 mm and the passageway may have for example a diameter of 8 mm to enable a heater element to slide in. The vane edges (in the V-shaped configuration) may be made to be fuel (e.g., tin) repellent to prevent (re-)formation of large droplets and to aid an efficient pick-up of the droplet by means of the drag force. Alternatively, the openings may be provided to be transversal in the vanes, or even angled. Any orientation of the opening is therefore envisaged herein which may be required in response to a specific thermal gradient induced by external heating factors.

Such vanes may be thus provided with openings such as a passageway wherein a heater element may be provided such that it uniformly heats up each vane segment. This requirement is due to the limited temperature range that is allowed: the vane segment needs to be heated above melting temperature of Tin (232° C.) while on the other hand, temperature levels above 350° C. should be avoided to prevent rapid chemical corrosion of the stainless steel segment. As a result, the requirements for uniform heating are rather strict.

Since the receiving structure is located in a near-vacuum environment, heat transfer by conduction or convection may be inefficient when commercial heater elements are used. The vanes may be (over)heated up by the heat provided by the plasma, however such heating is local and therefore less suitable to provide uniform and controlled heating along the receiving surface for capturing fuel debris that is generated with the formation of the plasma in order to melt the tin debris.

In order to heat the vane up to a desired temperature such as 300° C., it may be required for example to have the heater element at a much higher temperature, for example 600° C. or even higher. This is because heat transfer by radiation only becomes efficient if the temperature differences are high. Thermal conductive filler materials used in other applications to assist heat transfer will generally be unsuitable for use in the vacuum environment, for example due to outgassing. The choice of EUV-compatible thermal fillers is limited, to include for example ceramic materials which are sensitive to shock and will easily crack. Other heater element may be a tungsten wire such as for a bulb lamp filament, however such wires are not sufficiently long to provide the required heating and have a short lifetime, such that when they are burned may provide even more contamination to the radiation source apparatus. Inductive heater elements may be an alternative, however they requires a complex heating arrangement.

Another example of a commercial heater element is a resistive heater rod such as heater rods available from Thermocoax. Such heater rods are for example heater elements having screened electrical resistances of small diameter designed to be shaped and incorporated into a heating arrangement. They may comprise one or more straight current carrying cores in a flexible metal sheath, electrically insulated from one another and from the sheath. The resistive core may be extended at both ends by a different material of significantly lower resistance to obtain a cold-end construction. The resistive heater rod may thus be formed by a single core heating resistive wire with cold ends. The ends can be fitted with connectors. A cold part may have a lower electrical resistance than a hot part or may be thermally isolated.

The outer sheath may be continuous, such that only the inner core construction changes. A heater rod having a resistive wire can be given virtually any shape without deterioration of either its insulation or its sheath. To improve the heat contact, and thus heat transfer, the resistive wire can be deformed, brazed or welded into its desired position. The heating elements can be fitted onto any kind of material, either insulants or metal. Effectively, they can be bent, wrapped around a part, grooved or even brazed. There are thus several suitable methods of fitting to facilitate the heat exchange. The following are given in increasing order of efficiency: inserted into grooves, metal sprayed, cast into metal (e.g. zinc alloy, aluminium), etc. However, coiling up the resistive wires with a fixed pitch may cause temperature gradient. Measuring the hot length and varying the pitch is expensive and time consuming.

A further problem of such heater elements is corrosion in vacuum which may result in a non-operable heater. Another problem that may affect uniform heating of the vanes when using such commercial heater elements is the tolerance on the length of the heater element (10%). Because of the tolerance in the length of the wire, the hot part of the heater rod containing the heater wire will vary with the same percentage. This may cause a temperature gradient in itself and a difference from one heater rod to another. It would however be advantageous to keep the hot part of the heater element inside the vane and have the cold part (or ends) outside for a good temperature control.

The heating efficiency of commercial heater elements may also be relatively low, and power consumption higher than desired. Use of standard PTFE cable insulation is undesired because of the high temperature required on the wiring.

The heating using conventional heaters as described above suffers thus from several limitations. This patent application discloses a heating concept by which electrical power is dissipated as heat in the vane itself (rather than a remote heater element). The heater element has a portion with an adjustable length L in order to ensure uniform heating of the receiving surface. A portion herein also may include the full length of the heater element, i.e. the whole heater element may have an adjustable length. For example, the portion of heater element may have a spring like shape. The length may also be adjusted such as to accommodate the hot part having higher electrical resistance in the vane and the cold part having lower electrical resistance outside the vane. The hot part may also be partially outside the vane as long as it ensures uniform heating of the vane (for example a few mm would still be fine to extend outside, but 1 cm or more might already disturb the heating uniformity). However, the cold part of the heater element is preferably outside the vane. By such construction the vane becomes a better controllable heat source (besides the less controllable heat source generated by the plasma) and problems of heat transfer and high temperatures can be better avoided.

The adjustable length heater elements may be introduced in openings provided in the vanes and their length adjusted such that the hot part of the heater element uniformly heats up the vane (and the cold parts are outside the vanes). In this way the receiving structure may be heated by uniform heating of a given number of vanes forming a group in a location which is most likely to be contaminated, or even the full amount of the vanes comprised by the receiving structure, to a temperature which is sufficiently high such that the debris particles trapped by the contamination trap remain in a liquid state. The heater elements may fixed in the opening simply by means of gravity, by clamps or other means known in the art.

As said above, coiling a heating resistive wire (or other alternative forms of electrical conductor such as a tape, a bundle of resistive wires, etc) at a fixed pitch may cause a temperature gradient, which is undesired. A temperature gradient may also be caused by the plasma which also generates heat and can also locally heat the fuel receiving surfaces, as well as it may appear for example at the ends of the vanes. It may therefore be advantageous to modulate (i.e. locally arrange) the pitch of the resistive wire such that it counteracts and compensates for local temperature variations. In this manner, although the local heating provided by the heater element is not uniform over the full heater length, the end result is to provide uniform heating to the tin receiving surface of the vane regardless of other perturbation factors.

In one example it can be envisaged that the pitch of the resistive wire is larger in the central part of the heater element than the pitch at the ends of the heater, or in another example the pith may be locally adjusted to be smaller in a central part. Large temperature gradients along the heater element length may be also acceptable as long as that is needed to compensate for other (external) thermal influences exercised on the receiving surface. Temperature sensors and control loops may be provided at various places coupled to the receiving structure in order to keep the heating process under control.

Several demands interfere however when designing an effective heater element having an adjustable length. In first instance, the hot part of the resistive wire is preferably in good thermal contact over its full length with the sheath of material surrounding the carrying core (a rod) to prevent hot spots. On second instance, the wire is preferably coupled (for instance brazed) to the sheath of material and preferably has sufficient radiation surface in order to prevent overheating. On third instance, the temperature gradient over the full length the heater element, especially of the sheath of material, is preferably minimized.

FIG. 7(a) shows part of a heater element suitable for a heating arrangement according to the invention, where a double helix-shaped groove is provided in the wall of a sheath of material for holding the resistive wire (the wire is not represented). Alternatively other shaped groove (i.e. non-helix) may also be envisaged as long as a uniform heating is achieved (not illustrated) by placing the wire at equal distances. The resistive wire may be provided onto the helix groove and coupled thereto, for example by brazing, to fix the wire to the groove.

FIG. 7(b) illustrates a larger part of the heater element according to the invention. The heater element illustrated in FIG. 7(b) is a heater rod built using sheath of material as represented in FIG. 7(a) which surrounds a carrying core (such as a stainless steel cylinder or rod). A resistive wire is coiled and coupled to the sheath of material as described above, forming the hot part of the heater element. A single cut following the shape of the coiled resistive wire, or several smaller cuts, (both cut options being provided in the sheath of material between the resistive wires optionally provided in grooves) may be provided at regular distances, in order to provide an axially flexible heater element which has an adjustable axial length. By pulling or pushing the sheath of material provided with such cut(s) the axial length of the heater element is easily controllable, either manually or mechanically. The red spiral in FIG. 7(b) represents a lasercut sheet of material, however any means of cutting the sheath of material may be suitable. The heater rod is thus flexible in axial direction and may be fixed at both ends to the central rod at the required axial length. An endcap can be provided to guide the resistive wire when bent for backward coil (not shown). The ends of the central rod and endcaps are examples of cold parts of the heater element.

The resistive wire is preferably in contact via the groves with the sheath of material such that a suitable thermal contact takes place along the full sheath. This is advantageous because it avoids temperature gradients in the sheath. Also the electrical power provided to the resistive wire is preferably such that no temperature gradients are provided in the sheath of material.

The sheath area is also a parameter that may be used to tune the heater's element capacity. Ideally, the resistive wires are provided at a pitch that ensures an effective wire length for the desired temperature level. A suitable pitch length between two consecutive grooves may be in the range from 2 to 15 mm, preferably from 3 to 10 mm, such as 5 mm.

The length L, width D and the sheath area of the heater element should be sufficient in order to fully and uniformly heat a vane at a temperature above the melting temperature of the fuel. A suitable heater element axial length L is for example in the range from 5 to 200 cm, preferably in a range from 10 to 100 cm, more preferable in a range from 30 to 80 cm, such as about 50 cm. A suitable heater element width D is for example in a range from 2 to 15 cm, preferably from 5 to 10 cm, such as 8 cm. To allow easy insertion of the heater element in the opening, the distance between the sheath of material and the wall of the opening may be in a range from 0.5 to 3 cm, such as 1 cm. The gas which may be present in the source chamber may therefore enter in the opening and assist inductive heat transport between the sheath of material and the vane material.

A resistive wire length 1 and width d should be sufficient to provide a temperature between 600 to 1000° C. A suitable wire length 1 may be from 50 cm to 5 m, such as from 1 to 3 m. The resistive wire diameter d may be for instance in a range from 0.3 mm to 2 mm, preferably from 0.5 to 1.5 mm, such as 1 mm.

The heater rods according to the invention may be manufactured according to one or more of the following steps: braze the resistive wire into a grooved sheath of material, choose the pitch of the resistive wire winding such that sufficient radiation surface is available, braze the wire in a constant pitch grooved cylinder (see FIG. 7(a) or (b)) such that the longest possible hot part preferably fully fits in the opening, cut the sheath of material in between the resistive wire windings and optionally pull the resulting heater element to a required length and fix it on an inner carrying core.

Although in the examples above a resistive wire was described to provide the required heat, it is to be understood that any form of electrically conductive material is envisaged herein, such as a tape/strip or bundles or resistive wires, or other alternative forms of electrical conductors suitable to provide heat as known in the art. Furthermore, such electrical conductors are not necessarily brazed onto the sheath of material, but may be also coupled to the sheath by alternative means such as gluing or spraying.

A main advantage of this system is that a good thermal contact is achieved, with sufficient radiation surface and having the lowest possible temperature gradient. Sufficient radiation surface and good thermal contact are thereby provided. Also, as well as preventing build-up of contamination particles on reflective surfaces, the concepts herein can also protect sensors/detectors comprised in the source which may also be susceptible to contamination.

While the concepts disclosed herein have been described specifically in combination with LPP sources, they are also applicable to other types of sources, such as DPP sources. Also the contamination trap may take other forms to that shown, such as comprising a plurality of tapering blocks instead of vanes, or of vanes in a different arrangement.

Taking the above considerations into account, the disclosure enables the provision of a heating mechanism for receiving structures for fuel debris that solves the problems of obtaining heat transfer in a vacuum. Embodiments of the invention can have high efficiency and hence low power consumption, compared to conventional indirect heating. High internal temperatures are avoided on internal components and interconnects, allowing for example use of standard PTFE cable insulation.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Further, the radiation source described may be applied in radiation source arrangements for EUV radiation in other optical systems besides lithographic apparatus. An example would be a metrology apparatus using EUV radiation to benefit from the short wavelengths.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A radiation source apparatus configured to generate a beam of radiation by excitation of a fuel into a plasma, said apparatus comprising:
a plasma formation site located at a position in which a fuel will be contacted by a laser beam of radiation to form a plasma;
a receiving structure having a receiving surface for capturing fuel debris that is generated with the formation of the plasma; and
a heating arrangement for heating one or more receiving surfaces of said receiving structure to a temperature sufficient to liquefy said fuel debris such that it can be made to flow along the surface to another part of the apparatus, said arrangement comprising a heater element for heating of said receiving surface, wherein a portion of the heater element has an adjustable length for providing heating control of the heater element.

2. The apparatus according to claim 1, wherein the portion of the heater element has a spring like shape.

3. The apparatus as claimed in claim 1, wherein said receiving structure comprises a plurality of local structural elements and each local structural element is provided with the at least one opening constructed to allow inserting of the heater element.

4. The apparatus as claimed in claim 3, wherein said at least some of said local structural elements comprise elongated vanes running substantially parallel to one another and at angles oblique to a direction of said radiation beam.

5. The apparatus as claimed in claim 1, wherein said receiving structure comprises a substantially cylindrical or frusto-conical structure surrounding a path of said radiation beam, and lined with a plurality of local structural elements, each element being provided with one or more heater elements for heating the vane.

6. The apparatus according to claim 5, wherein an outer periphery of the local structural elements are made of, or coated with, a material having properties which repel the fuel.

7. The apparatus according to claim 6, wherein the receiving structure is coupled to a wall of the radiation source apparatus, the receiving surface of the receiving structure being configured to reduce an amount of debris particles that scatter or splash from the wall of the source onto a collector of the source.

8. The apparatus according to claim 7, wherein the receiving structure is provided outside an outer boundary of an EUV radiation cone formed by the collector.

9. The apparatus according to claim 1, wherein the heater element is a heater rod comprising:
a sheath of material surrounding a carrying core, and
an electrical wire coiled around and coupled to the sheath of material.

10. The apparatus according to claim 9, wherein the electrical wire is a resistive wire coiled around the sheath of material at a pitch that ensures an effective wire length for a temperature level sufficient to liquefy said fuel debris such that it can be made to flow along the surface to another part of the apparatus.

11. The apparatus according to claim 10, wherein the sheath of material is provided with a groove following said pitch, wherein the resistive wire is coupled to the groove.

12. The apparatus according to claim 10, wherein one or more cuts are provided in the sheath of material in between the corresponding location of the coiled resistive wire.

13. The apparatus according to claim 12, wherein the cut is provided along the full length of the sheath of material to provide an adjustable sheath length along the axial direction of the heater element.

14. The apparatus according to claim 10, wherein the pitch is modulated along the length of the heater element such as to compensate local temperature variations of the receiving surface.

15. The apparatus according to claim 1, wherein said heating arrangement is configured to heat said surface to a temperature in the range 250° C. to 500° C., for example a temperature above 280° C. and below 350° C.

16. The apparatus as claimed in claim 1, wherein the fuel is excited by laser radiation to generate said beam of EUV radiation.

17. A lithographic apparatus, comprising:
a radiation source apparatus configured to generate a beam of radiation by excitation of a fuel into a plasma, said apparatus comprising:
a plasma formation site located at a position in which a fuel will be contacted by a laser beam of radiation to form a plasma,
a receiving structure having a receiving surface for capturing fuel debris that is generated with the formation of the plasma, and
a heating arrangement for heating one or more receiving surfaces of said receiving structure to a temperature sufficient to liquefy said fuel debris such that it can be made to flow along the surface to another part of the apparatus, said arrangement comprising a heater element for heating of said receiving surface, wherein a portion of the heater element has an adjustable length for providing heating control of the heater element; and
wherein the lithographic apparatus is configured to generate a beam of EUV radiation, and EUV optical systems configured to receive said beam and to use it to transfer a pattern from a patterning device to a substrate.

18. An optical apparatus, comprising:
a radiation source apparatus configured to generate a beam of radiation by excitation of a fuel into a plasma, said apparatus comprising:
a plasma formation site located at a position in which a fuel will be contacted by a laser beam of radiation to form a plasma,
a receiving structure having a receiving surface for capturing fuel debris that is generated with the formation of the plasma, and
a heating arrangement for heating one or more receiving surfaces of said receiving structure to a temperature sufficient to liquefy said fuel debris such that it can be made to flow along the surface to another part of the apparatus, said arrangement comprising a heater element for heating of said receiving surface, wherein a portion of the heater element has an adjustable length for providing heating control of the heater element; and
wherein the optical apparatus is configured to generate a beam of EUV radiation, and EUV optical systems configured to receive and condition the beam and to deliver the beam to a target location.

19. A method of generating extreme ultraviolet radiation, the method comprising:
contacting a fuel with a beam of radiation, thereby forming a plasma at a plasma formation site;

configuring a receiving structure having a receiving surface to trap debris particles that are generated with the formation of the plasma; and heating the receiving surface with a heating element inserted in an opening of the receiving structure.

20. The method according to claim 19, further comprising heating the receiving surface to a temperature sufficient to melt debris that is trapped by the receiving surface.

\* \* \* \* \*